United States Patent
Miyamoto et al.

(10) Patent No.: US 9,985,606 B2
(45) Date of Patent: May 29, 2018

(54) ACOUSTIC WAVE FILTER, DUPLEXER, AND MODULE

(71) Applicant: TAIYO YUDEN CO., LTD., Tokyo (JP)

(72) Inventors: Ryo Miyamoto, Tokyo (JP); Masato Ito, Tokyo (JP); Osamu Kawachi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 37 days.

(21) Appl. No.: 15/338,008

(22) Filed: Oct. 28, 2016

(65) Prior Publication Data
US 2017/0163242 A1 Jun. 8, 2017

(30) Foreign Application Priority Data
Dec. 2, 2015 (JP) ................................. 2015-236092

(51) Int. Cl.
| | | |
|---|---|---|
| *H03H 9/54* | (2006.01) | |
| *H03H 9/70* | (2006.01) | |
| *H03H 9/60* | (2006.01) | |

(52) U.S. Cl.
CPC ............ *H03H 9/542* (2013.01); *H03H 9/605* (2013.01); *H03H 9/70* (2013.01)

(58) Field of Classification Search
CPC .................................. H03H 9/54; H03H 9/70
(Continued)

(56) References Cited

U.S. PATENT DOCUMENTS

| | | | | |
|---|---|---|---|---|
| 6,670,866 B2 * | 12/2003 | Ella | ...................... | H03H 9/0095 310/366 |
| 7,479,847 B2 * | 1/2009 | Yamakawa | .............. | H03H 9/25 333/133 |

(Continued)

FOREIGN PATENT DOCUMENTS

| | | |
|---|---|---|
| JP | H11-41055 A | 2/1999 |
| JP | 2008-508822 A | 3/2008 |

(Continued)

OTHER PUBLICATIONS

Japanese Office Action dated Mar. 6, 2018, in a counterpart Japanese patent application No. 2015-236092. (A machine translation (not reviewed for accuracy) attached.).

*Primary Examiner* — Dean Takaoka
*Assistant Examiner* — Alan Wong
(74) *Attorney, Agent, or Firm* — Chen Yoshimura LLP

(57) ABSTRACT

An acoustic wave filter includes: series resonators connected in series between input and output terminals; and lines connected in parallel to the series resonators, wherein at least one of the lines includes: a first resonator including a piezoelectric substance, and first lower and upper electrodes sandwiching the piezoelectric substance in a c-axis orientation direction of the piezoelectric substance; a second resonator that is connected in series to the first resonator, and includes another piezoelectric substance, and second lower and upper electrodes sandwiching the another piezoelectric substance so that one of the second lower and upper electrodes in the c-axis orientation direction have an electric potential equal to that of one of the first lower and upper electrodes in the c-axis orientation direction; and a capacitor connected in parallel to one of the first and second resonators and not connected in parallel to another one of the first and second resonators.

10 Claims, 19 Drawing Sheets

(58) Field of Classification Search
USPC .................................................. 333/189–192
See application file for complete search history.

(56) References Cited

U.S. PATENT DOCUMENTS

| | | | | |
|---|---|---|---|---|
| 7,535,323 | B2* | 5/2009 | Barber | H03H 9/02086 |
| | | | | 310/357 |
| 7,548,140 | B2* | 6/2009 | Jamneala | H03H 9/581 |
| | | | | 310/357 |
| 8,018,298 | B2* | 9/2011 | Ueda | H03H 9/562 |
| | | | | 333/133 |
| 2008/0055021 | A1 | 3/2008 | Ueda et al. | |
| 2008/0246556 | A1 | 10/2008 | Heinze et al. | |

FOREIGN PATENT DOCUMENTS

| | | |
|---|---|---|
| JP | 2008-85989 A | 4/2008 |
| JP | 2008-141561 A | 6/2008 |
| JP | 2012-147175 A | 8/2012 |

* cited by examiner

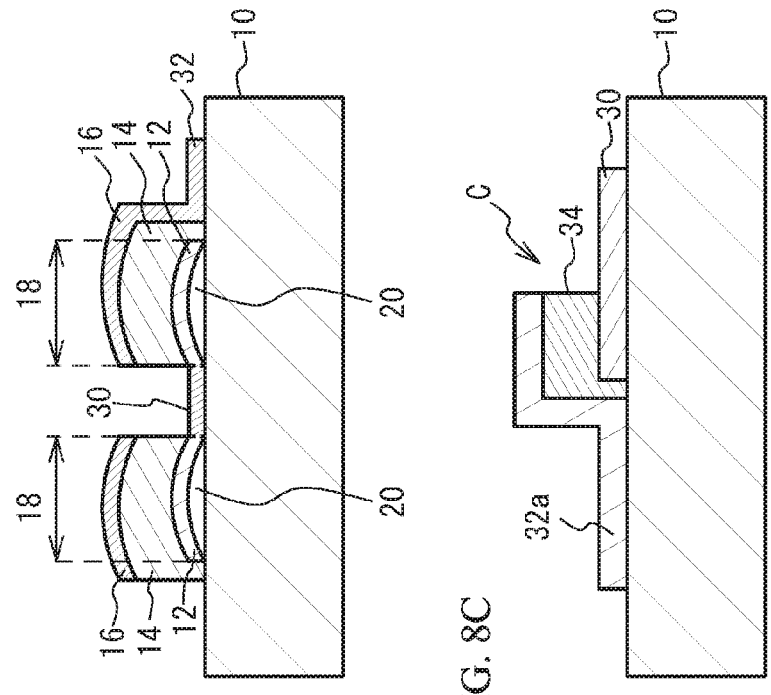
FIG. 8B
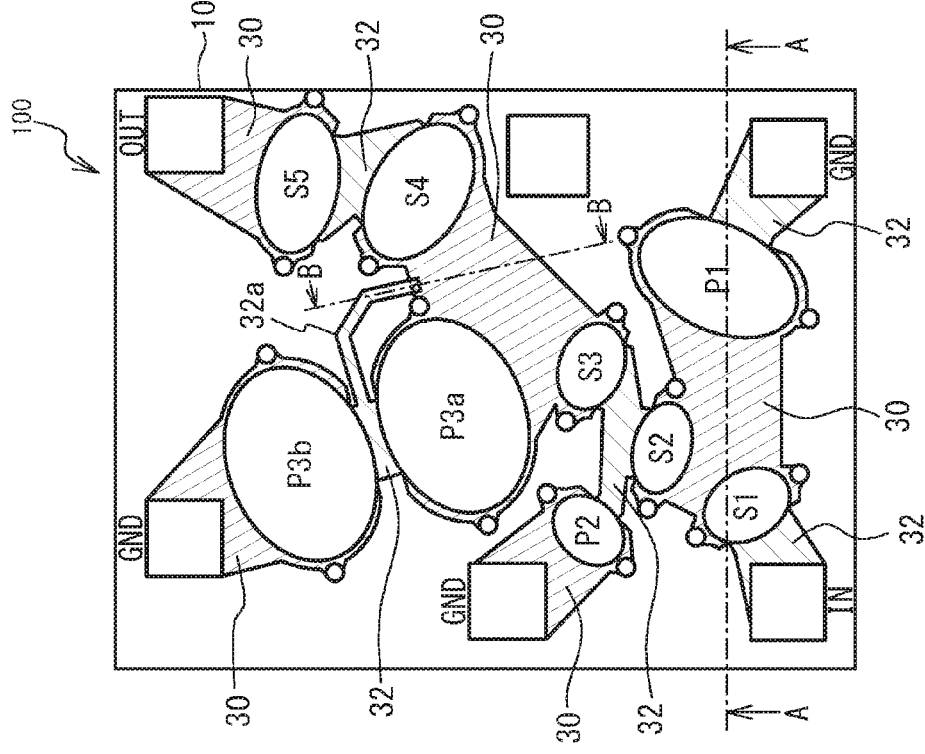
FIG. 8C
FIG. 8A

ACOUSTIC WAVE FILTER, DUPLEXER, AND MODULE

CROSS-REFERENCE TO RELATED APPLICATION

This application is based upon and claims the benefit of priority of the prior Japanese Patent Application No. 2015-236092, filed on Dec. 2, 2015, the entire contents of which are incorporated herein by reference.

FIELD

A certain aspect of the present invention relates to an acoustic wave filter, a duplexer, and a module.

BACKGROUND

As a filter used in a communication device such as a mobile phone, there has been known a ladder-type filter in which piezoelectric thin film resonators each including a lower electrode and an upper electrode sandwiching a piezoelectric substance are connected in a ladder form. A duplexer and a module including a plurality of filters may be installed in a communication device.

When large electrical power is input to a piezoelectric thin film resonator, non-linearity due to the c-axis orientation of a piezoelectric substance causes secondary distortion (second harmonic) in output signals. As a method of reducing the secondary distortion, it has been known to serially divide a piezoelectric thin film resonator constituting a ladder-type filter and make the electrode of one of the divided resonators in the c-axis orientation direction or the polarization axis direction of the piezoelectric substance have an identical electric potential to the electric potential of the electrode of the other of the divided resonators in the c-axis orientation direction or the polarization axis direction of the piezoelectric substance, or to divide a piezoelectric thin film resonator in parallel and make the electrode of one of the divided resonators in the c-axis orientation direction or the polarization axis direction of the piezoelectric substance have an electric potential opposite to the electric potential of the electrode of the other of the divided resonators in the c-axis orientation direction or the polarization axis direction of the piezoelectric substance as disclosed in, for example, Japanese Patent Application Publication No. 2008-85989 (Patent Document 1).

In the structure where a metal layer is located to cover a plurality of piezoelectric thin film resonators located on the substrate, the deterioration of the characteristics may be caused by a parasitic capacitance between the electrodes constituting the piezoelectric thin film resonator and the metal layer. To inhibit the deterioration of the characteristics, it has been known to connect an inductor in series between the metal layer and a ground as disclosed in, for example, Japanese Patent Application Publication No. 2008-508822. In a ladder-type filter using a piezoelectric thin film resonator, the deterioration of the filter characteristic may be caused by parasitic capacitance formed by opposing the lower electrode and the upper electrode in a region other than a cavity. To inhibit the deterioration of the filter characteristic, it has been known to extend the upper electrode from the resonator in only one direction in all series resonators as disclosed in, for example, Japanese Patent Application Publication No. 2008-141561.

With reference to Patent Document 1, it may be considered to divide a parallel resonator in series or in parallel to reduce secondary distortion in an acoustic wave filter including a series resonator connected in series and a parallel resonator connected in parallel between an input terminal and an output terminal. However, it has been newly found that secondary distortion locally increases when the parallel resonator is divided in series or in parallel.

SUMMARY OF THE INVENTION

According to a first aspect of the present invention, there is provided an acoustic wave filter including: one or more series resonators connected in series between an input terminal and an output terminal; and one or more lines connected in parallel to the one or more series resonators, wherein at least one line of the one or more lines includes: a first resonator that includes a piezoelectric substance, and a first lower electrode and a first upper electrode sandwiching the piezoelectric substance in a direction of a c-axis orientation or a polarization axis of the piezoelectric substance; a second resonator that is connected in series to the first resonator, and includes another piezoelectric substance, and a second lower electrode and a second upper electrode sandwiching the another piezoelectric substance so that one of the second lower electrode and the second upper electrode in the direction of the c-axis orientation or the polarization axis have an electric potential equal to an electric potential of one of the first lower electrode and the first upper electrode of the first resonator in the direction of the c-axis orientation or the polarization axis; and a capacitor that is connected in parallel to only one of the first resonator and the second resonator, and is not connected in parallel to another one of the first resonator and the second resonator.

According to a second aspect of the present invention, there is provided an acoustic wave filter including: one or more series resonators connected in series between an input terminal and an output terminal; and one or more lines connected in parallel to the one or more series resonators, wherein at least one of the one or more lines includes: a first resonator that includes a piezoelectric substance, and a first lower electrode and a first upper electrode sandwiching the piezoelectric substance in a direction of a c-axis orientation or a polarization axis of the piezoelectric substance; a second resonator that is connected in parallel to the first resonator, and includes another piezoelectric substance, and a second lower electrode and a second upper electrode sandwiching the another piezoelectric substance so that one of the second lower electrode and the second upper electrode in the direction of the c-axis orientation or the polarization axis have an electric potential opposite to an electric potential of one of the first lower electrode and the first upper electrode of the first resonator in the direction of the c-axis orientation or the polarization axis; and a capacitor that is connected between an input side node and an output side node of one of the first resonator and the second resonator and is not connected between an input side node and an output side node of another one of the first resonator and the second resonator.

According to a third aspect of the present invention, there is provided a duplexer including: a transmit filter; and a receive filter, wherein at least one of the transmit filter and the receive filter is the above acoustic wave filter.

According to a fourth aspect of the present invention, there is provided a module including: the above acoustic wave filter.

BRIEF DESCRIPTION OF THE DRAWINGS

FIG. 8A is a plan view of the ladder-type filter in accordance with the first embodiment, FIG. 8B is a cross-sectional view taken along line A-A in FIG. 8A, and FIG. 8C is a cross-sectional view taken along line B-B in FIG. 8A;

DETAILED DESCRIPTION

Hereinafter, embodiments of the present invention will be described with reference to the accompanying drawings.

First Embodiment

Figure 1A:
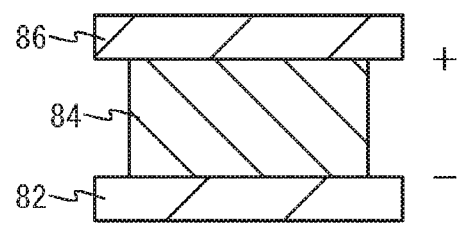
FIG. 1A and FIG. 1B illustrate a piezoelectric thin film resonator having a piezoelectric substance sandwiched between a pair of electrodes.
Figure 1B:
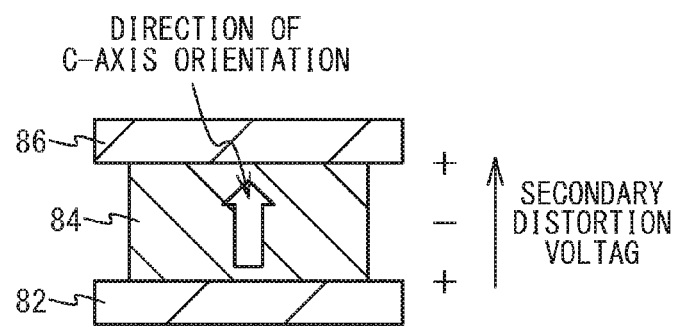

First described is a secondary distortion voltage produced in a piezoelectric substance of a piezoelectric thin film resonator. FIG. 1A and FIG. 1B illustrate a piezoelectric thin film resonator having a piezoelectric substance 84 sandwiched between a pair of electrodes (a lower electrode 82 and an upper electrode 86). The piezoelectric thin film resonator has a thickness of the piezoelectric substance equal to a half of the wavelength ($\lambda$) of the resonant frequency. That is, the piezoelectric thin film resonator is a resonator using $\frac{1}{2}\lambda$ thickness resonance. Thus, as illustrated in FIG. 1A, the piezoelectric substance 84 is excited so that one of the upper and lower surfaces is polarized positively or negatively and the other is polarized positively or negatively.

In contrast, the wavelength of the frequency of secondary distortion corresponds to the thickness of the piezoelectric substance. Thus, as illustrated in FIG. 1B, the piezoelectric substance 84 is excited so that both the upper and lower surfaces are polarized positively or negatively. When the piezoelectric substance 84 is symmetry, the upper and lower electrodes have an identical electric potential in the secondary mode. In this case, the distortion component is not generated theoretically. However, the symmetry in the c-axis orientation direction is distorted and the electric field has uneven distribution if the resonator is structured as follows to obtain good characteristics. The piezoelectric substance 84 is made of aluminum nitride (AlN) or zinc oxide (ZnO). The piezoelectric substance 84 is sandwiched between the lower electrode 82 and the upper electrode 86 in the c-axis orientation direction of the piezoelectric substance 84. A white arrow in the piezoelectric substance 84 in FIG. 1B indicates the direction of the c-axis orientation of the piezoelectric substance 84. The uneven distribution of the electric field causes a potential difference between the upper and lower surfaces of the piezoelectric substance 84. A voltage thus generated is called secondary distortion voltage, and is indicated by an arrow arranged along the side of the piezoelectric substance 84. In FIG. 1B, the c-axis is oriented in the direction from the lower electrode 82 to the upper electrode 86, so that the secondary distortion voltage is generated in the above direction.

Figure 2A:
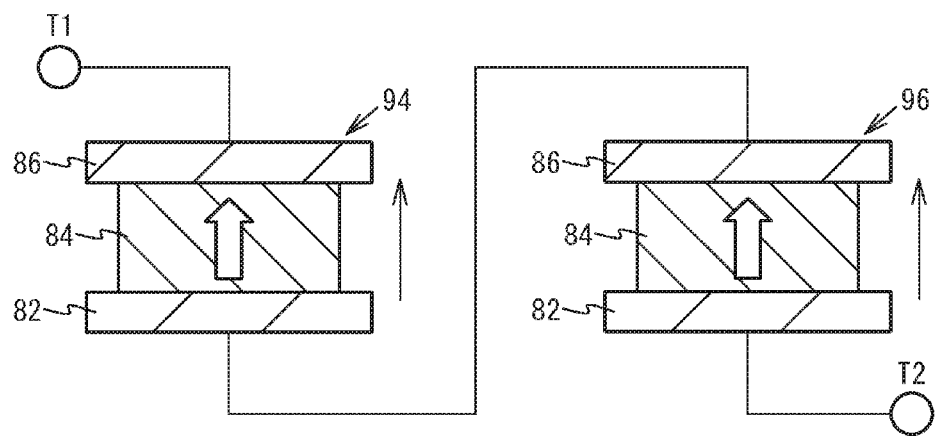
FIG. 2A and FIG. 2B are diagrams for describing a first method of reducing a secondary distortion voltage.
Figure 2B:
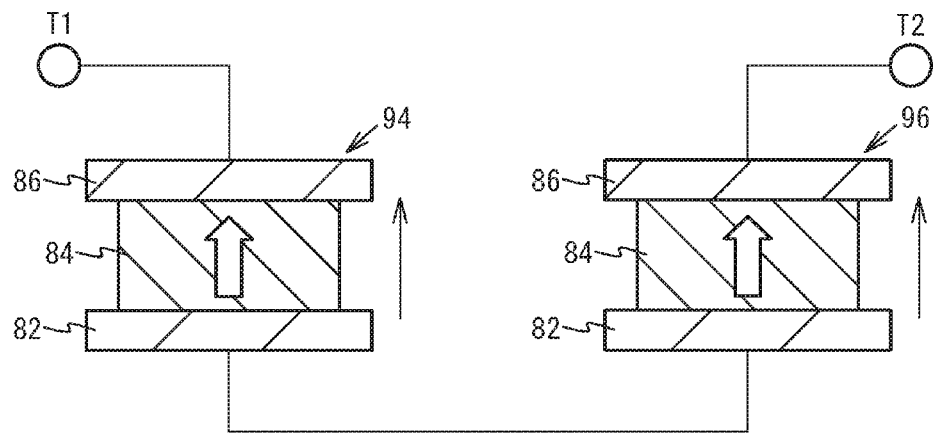

A first method of reducing the secondary distortion voltage will be described with reference to FIG. 2A and FIG. 2B. FIG. 2A illustrates an exemplary case where the secondary distortion voltage is not reduced, and FIG. 2B illustrates an exemplary case where the secondary distortion voltage is reduced. In FIG. 2A, a first piezoelectric thin film resonator 94 and a second piezoelectric thin film resonator 96 are connected in series. The first and second piezoelectric thin film resonators 94 and 96 are connected so that the electrode of one of the first and second piezoelectric thin film resonators 94 and 96 in the reverse direction of the c-axis orientation direction has an identical electric potential to the electric potential of the electrode of the other in the c-axis orientation direction. That is, the lower electrode 82 of the first piezoelectric thin film resonator 94 in the reverse direction of the c-axis orientation direction and the upper electrode 86 of the second piezoelectric thin film resonator 96 in the c-axis orientation direction are connected so as to have an identical electric potential. Accordingly, the secondary distortion voltages of the first and second piezoelectric thin film resonators 94 and 96 are added in the direction from a terminal T2 to a terminal T1. Therefore, the whole secondary distortion voltage is increased.

In contrast, in FIG. 2B, the first and second piezoelectric thin film resonators 94 and 96 are connected in series. The first and second piezoelectric thin film resonators 94 and 96 are connected so that the electrodes in the c-axis orientation direction have an identical electric potential. That is, the lower electrode 82 of the first piezoelectric thin film resonator 94 in the reverse direction of the c-axis orientation and the lower electrode 82 of the second piezoelectric thin film resonator 96 in the reverse direction of the c-axis orientation direction are connected so as to have an identical electric potential. Accordingly, the secondary distortion voltage of the first piezoelectric thin film resonator 94 is applied in the direction from the terminal T2 to the terminal T1, and the secondary distortion voltage of the second piezoelectric thin film resonator 96 is applied in the direction from the terminal T1 to the terminal T2. Accordingly, the secondary distortion voltages of the first and second piezoelectric thin film resonators 94 and 96 cancel out each other. Therefore, the whole secondary distortion can be reduced.

Figure 3A:
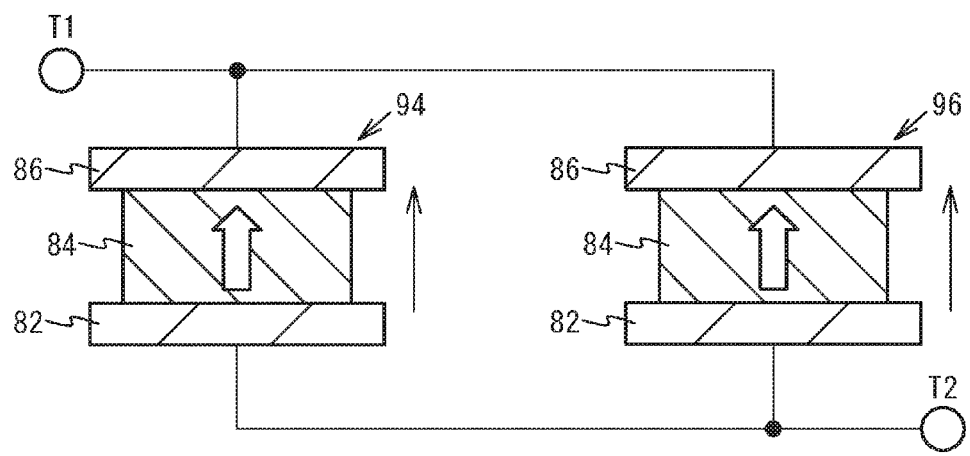
FIG. 3A and FIG. 3B are diagrams for describing a second method of reducing a secondary distortion voltage.
Figure 3B:
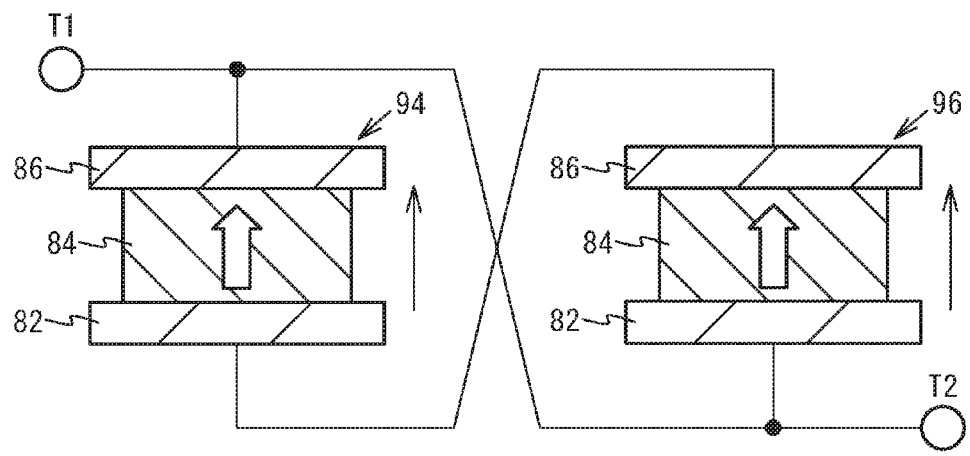

A second method of reducing the secondary distortion voltage will be described with FIG. 3A and FIG. 3B. FIG. 3A illustrates an exemplary case where the secondary distortion voltage is not reduced, and FIG. 3B illustrates an exemplary case where the secondary distortion voltage can be reduced. In FIG. 3A, the first and second piezoelectric thin film resonators 94 and 96 are connected in parallel. The first and second piezoelectric thin film resonators 94 and 96 are connected so that the electrodes in the c-axis orientation direction have an identical electric potential. That is, the upper electrodes 86 of the first and second piezoelectric thin film resonators 94 and 96 in the c-axis orientation direction are connected so as to have an identical electric potential. Moreover, the lower electrodes 82 of the first and second piezoelectric thin film resonators 94 and 96 in the reverse direction of the c-axis orientation direction are connected so as to have an identical electric potential. Accordingly, the secondary distortion voltages of the first and second piezoelectric thin film resonators 94 and 96 are applied in the direction from the terminal T2 to the terminal T1. Therefore, the whole secondary distortion voltage is increased.

In contrast, in FIG. 3B, the first and second piezoelectric thin film resonators 94 and 96 are connected in parallel and the first and second piezoelectric thin film resonators 94 and 96 are connected so that the electrodes in the c-axis orientation direction have opposite electric potentials. That is, the upper electrode 86 of the first piezoelectric thin film resonator 94 is coupled to the lower electrode 82 of the second piezoelectric thin film resonator 96, and the lower electrode 82 of the first piezoelectric thin film resonator 94 is coupled to the upper electrode 86 of the second piezoelectric thin film resonator 96. Thus, the secondary distortion voltage of the first piezoelectric thin film resonator 94 is applied in the direction from the terminal T2 to the terminal T1, and the secondary distortion voltage of the second piezoelectric thin film resonator 96 is applied in the direction from the terminal T1 to the terminal T2. Accordingly, the secondary distortion voltages of the first and second piezoelectric thin film resonators 94 and 96 cancel out each other. Therefore, the whole secondary distortion can be reduced.

Figure 4A:
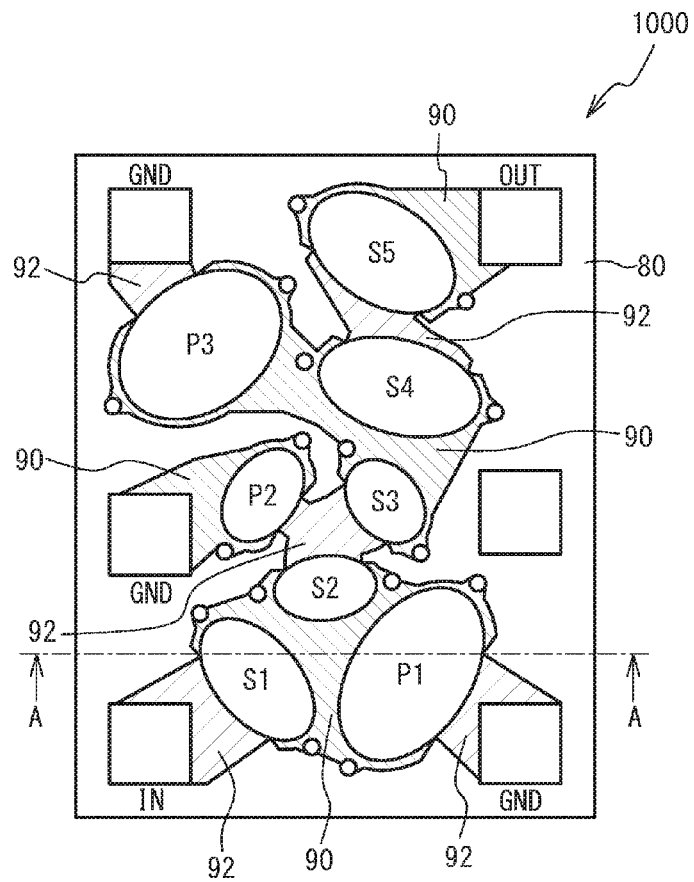
FIG. 4A is a plan view of a ladder-type filter in accordance with a first comparative example.
Figure 4B:
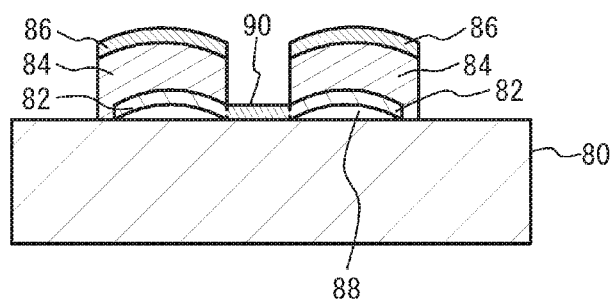
FIG. 4B is a cross-sectional view taken along line A-A in FIG. 4A.

Next, ladder-type filters in accordance with first and second comparative examples will be described. FIG. 4A is a plan view of a ladder-type filter 1000 in accordance with the first comparative example, and FIG. 4B is a cross-sectional view taken along line A-A in FIG. 4A. As illustrated in FIG. 4A and FIG. 4B, the ladder-type filter 1000 of the first comparative example includes series resonators S1 through S5 connected in series and parallel resonators P1 through P3 connected in parallel between an input electrode pad IN and an output electrode pad OUT. In each of the series resonators S1 through S5 and the parallel resonators P1 through P3, the lower electrode 82 made of, for example, ruthenium (Ru) is located on a substrate 80 such as, for example, a silicon substrate. Located on the lower electrode 82 is the piezoelectric substance 84 made of, for example, AlN. Located on the piezoelectric substance 84 is the upper electrode 86 made of, for example, Ru. In a region where the lower electrode 82 and the upper electrode 86 overlap with each other across the piezoelectric substance 84, an air gap 88 is formed between the substrate 80 and the lower electrode 82.

The upper electrode 86 of the series resonator S1 is coupled to the input electrode pad IN through an upper wiring line 92. The lower electrode 82 of the series resonator S1 is coupled to the lower electrodes 82 of the series resonator S2 and the parallel resonator P1 through a lower wiring line 90. The upper electrode 86 of the parallel resonator P1 is coupled to a ground electrode pad GND through the upper wiring line 92. The upper electrode 86 of the series resonator S2 is coupled to the upper electrodes 86 of the series resonator S3 and the parallel resonator P2 through the upper wiring line 92. The lower electrode 82 of the parallel resonator P2 is coupled to the ground electrode pad GND through the lower wiring line 90. The lower electrode 82 of the series resonator S3 is coupled to the lower electrodes 82 of the series resonator S4 and the parallel resonator P3 through the lower wiring line 90. The upper electrode 86 of the parallel resonator P3 is coupled to the ground electrode pad GND through the upper wiring line 92. The upper electrode 86 of the series resonator S4 is coupled to the upper electrode 86 of the series resonator S5 through the upper wiring line 92. The lower electrode 82 of the series resonator S5 is coupled to the output electrode pad OUT through the lower wiring line 90.

Figure 5:
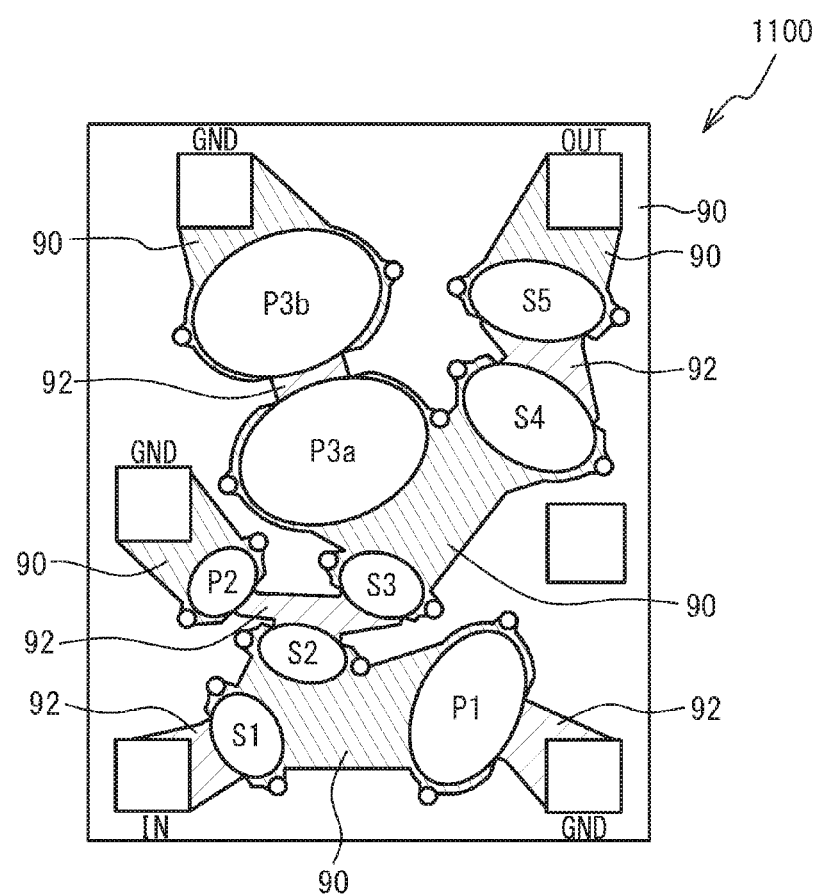
FIG. 5 is a plan view of a ladder-type filter in accordance with a second comparative example.

FIG. 5 is a plan view of a ladder-type filter 1100 in accordance with the second comparative example. As illustrated in FIG. 5, in the ladder-type filter 1100 of the second comparative example, the parallel resonator P3 is divided into a first resonator P3a and a second resonator P3b. The upper electrode 86 of the first resonator P3a and the upper electrode 86 of the second resonator P3b are interconnected through the upper wiring line 92. The first resonator P3a and the second resonator P3b are connected in series so that the electrode of one of the first and second resonators P3a and P3b in the c-axis orientation direction of the piezoelectric substance 84 has an identical electric potential to the electric potential of the other of the first and second resonators P3a and P3b in the c-axis orientation direction of the piezoelectric substance 84. Other configurations are the same as those of the first comparative example, and thus the description is omitted.

Figure 6:
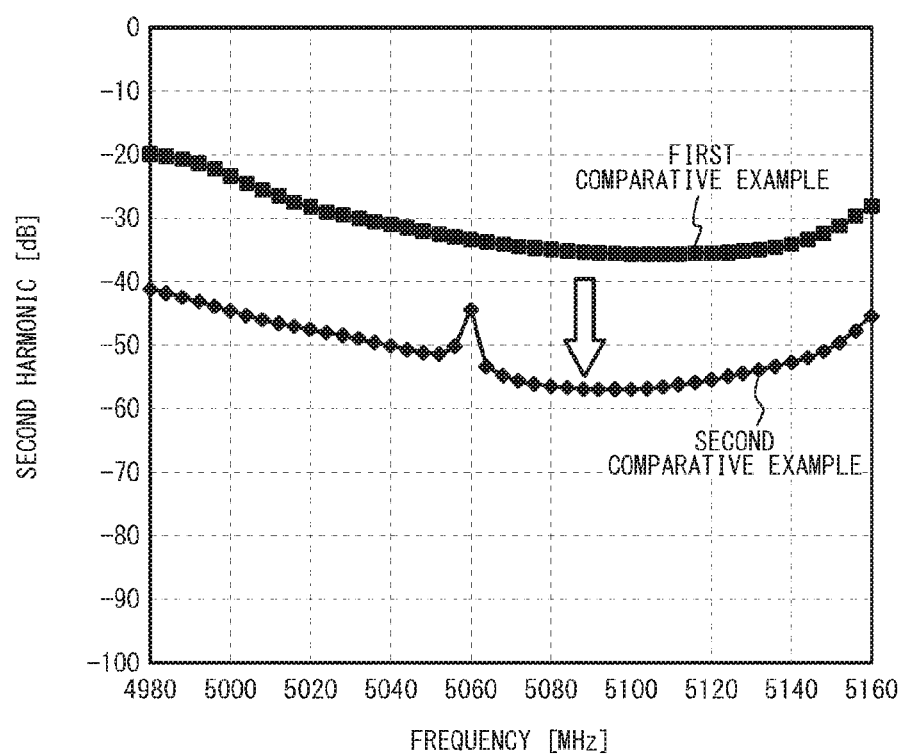
FIG. 6 illustrates simulation results of secondary distortion in the ladder-type filters of the first and second comparative examples.

FIG. 6 illustrates simulation results of secondary distortion in the ladder-type filter 1000 of the first comparative example and the ladder-type filter 1100 of the second comparative example. The horizontal axis in FIG. 6 represents frequency (MHz). The vertical axis represents second harmonic (dB). The simulation was conducted as follows. The passband of the ladder-type filter was configured to be 2500 MHz to 2570 MHz, an electrical power of 28 dBm was input to the input terminal, and an output electrical power at 4980 MHz to 5160 MHz was measured at the output terminal. As illustrated in FIG. 6, the second comparative example reduces second harmonic compared to the first comparative example. This reason is considered as follows. In the second comparative example, the parallel resonator P3 is divided into the first and second resonators P3a and P3b connected in series so that the electrode of one of the first and second resonators P3a and P3b in the c-axis orientation direction of the piezoelectric substance 84 has an identical electric potential to the electric potential of the other of the first and second resonators P3a and P3b in the c-axis orientation direction of the piezoelectric substance 84, and thus the secondary distortion voltages cancel out each other.

In the second comparative example, however, the overall level of the second harmonic is reduced, but the second harmonic at around 5060 MHz is locally high. Thus, hereinafter, embodiments capable of reducing such a local peak of the second harmonic will be described.

Figure 7:
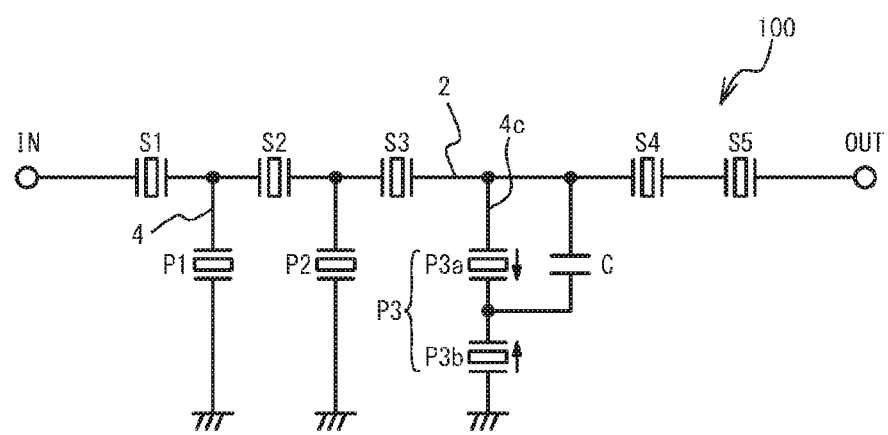
FIG. 7 is a circuit diagram of a ladder-type filter in accordance with a first embodiment.

FIG. 7 is a circuit diagram of a ladder-type filter 100 in accordance with a first embodiment. As illustrated in FIG. 7, the ladder-type filter 100 of the first embodiment includes one or more series resonators S1 through S5 connected in series in a line 2 connected in series between an input terminal IN and an output terminal OUT. Parallel resonators P1 through P3 are located in one or more lines 4 connected in parallel to the one or more series resonators S1 through S5. The parallel resonator P3 located in a line 4c is divided into the first resonator P3a and the second resonator P3b. A capacitor C is connected in parallel to the first resonator P3a. In other words, one or more series resonators S1 through S5 are connected in series and one or more parallel resonators P1 through P3 are connected in parallel between the input terminal IN and the output terminal OUT. The parallel resonator P3 is divided into the first and second resonators P3a and P3b. The capacitor C is connected in parallel to the first resonator P3a.

The first resonator P3a and the second resonator P3b are connected in series so that the electrode of one of the first and second resonators P3a and P3b in the c-axis orientation direction of the piezoelectric substance has an electric potential equal to the electric potential of the electrode of the other of the first and second resonators P3a and P3b in the c-axis orientation direction of the piezoelectric substance. Thus, the secondary distortion voltages (indicated by arrows in FIG. 7) are generated in opposite directions. The electrostatic capacitances of the first and second resonators P3a and P3b are a half of the electrostatic capacitance of the parallel resonator P3, and approximately equal to each other. The first and second resonators P3a and P3b have an approximately identical resonant frequency and an approximately identical impedance. The term "approximately identical" permits the difference caused by production error.

FIG. 8A is a plan view of the ladder-type filter 100 in accordance with the first embodiment, FIG. 8B is a cross-sectional view taken along line A-A in FIG. 8A, and FIG. 8C is a cross-sectional view taken along line B-B in FIG. 8A. As illustrated in FIG. 8A and FIG. 8B, between the input electrode pad IN and the output electrode pad OUT, one or more series resonators S1 through S5 are connected in series and one or more parallel resonators P1 through P3 are connected in parallel. The input electrode pad IN corresponds to the input terminal IN in FIG. 7, and the output electrode pad OUT corresponds to the output terminal OUT in FIG. 7.

The series resonators S1 through S5 and the parallel resonators P1 through P3 are piezoelectric thin film resonators each having a thin film piezoelectric substance 14 sandwiched between a pair of electrodes (a lower electrode 12 and an upper electrode 16). The lower electrode 12, the piezoelectric substance 14, and the upper electrode 16 are located on a substrate 10. Between the flat upper surface of the substrate 10 and the lower electrode 12 in a region 18 where the lower electrode 12 overlaps with the upper electrode 16 across the piezoelectric substance 14, formed is an air gap 20 having a dome-shaped bulge toward the lower electrode 12. The dome-shaped bulge is a bulge having a shape in which the height of the air gap 20 is low in, for example, the periphery of the air gap 20 and increases at closer distances to the center of the air gap 20. The region 18, above the air gap 20, in which the lower electrode 12 and the upper electrode 16 face each other across the piezoelectric substance 14 is a resonance region. The resonance region has, for example, an elliptical shape, and is a region in which the thickness extension mode resonates. The resonance region may have a shape, such as a polygonal shape, other than an elliptical shape. Instead of the dome-shaped bulge, the air gap 20 may be a recess that is formed in the substrate 10 and penetrates through or does not penetrate through the substrate 10. Alternatively, instead of the air gap 20, an acoustic mirror may be formed.

The upper electrode 16 of the series resonator S1 is coupled to the input electrode pad IN through an upper wiring line 32. The lower electrode 12 of the series resonator S1 is coupled to the lower electrodes 12 of the series resonator S2 and the parallel resonator P1 through a lower wiring line 30. The upper electrode 16 of the parallel resonator P1 is coupled to the ground electrode pad GND through the upper wiring line 32. The upper electrode 16 of the series resonator S2 is coupled to the upper electrodes 16 of the series resonator S3 and the parallel resonator P2 through the upper wiring line 32. The lower electrode 12 of the parallel resonator P2 is coupled to the ground electrode pad GND through the lower wiring line 30. The lower electrode 12 of the series resonator S3 is coupled to the lower electrodes 12 of the series resonator S4 and the first resonator P3a through the lower wiring line 30. The upper electrode 16 of the first resonator P3a is coupled to the upper electrode 16 of the second resonator P3b through the upper wiring line 32. The lower electrode 12 of the second resonator P3b is coupled to the ground electrode pad GND through the lower wiring line 30. The upper electrode 16 of the series resonator S4 is coupled to the upper electrode 16 of the series resonator S5 through the upper wiring line 32. The lower electrode 12 of the series resonator S5 is coupled to the output electrode pad OUT through the lower wiring line 30.

The substrate 10 is, for example, a silicon substrate, or may be, for example, a quartz substrate, a glass substrate, a ceramic substrate, or a gallium arsenide substrate. The lower electrode 12 and the upper electrode 16 are made of, for example, Ru, or may be made of a single layer metal film of, for example, chrome (Cr), aluminum (Al), titanium (Ti), copper (Cu), molybdenum (Mo), tungsten (W), tantalum (Ta), platinum (Pt), rhodium (Rh), or iridium (Ir), or a multilayered film of at least two of the above materials. The piezoelectric substance 14 is, for example, AlN, or may be, for example, ZnO.

As illustrated in FIG. 8A and FIG. 8C, an upper wiring line 32a extending from the upper wiring line 32 connecting the first and second resonators P3a and P3b extends so as to overlap with a part of the lower wiring line 30 connecting to the lower electrode 12 of the first resonator P3a. A dielectric film 34 is located between the upper wiring line 32a and the lower wiring line 30. This structure forms the capacitor C connected in parallel to the first resonator P3a. The dielectric film 34 may be, for example, an AlN film, a MgO film, or a silicon oxide film ($SiO_2$ film).

Here, the effect achieved by connecting the capacitor C in parallel to the first resonator P3a will be described with use of the simulation conducted by the inventors. FIG. 9A through FIG. 10B are plan views of first through fourth ladder-type filters used for the simulation. FIG. 11A through FIG. 11D illustrate simulation results of secondary distortion in the first through fourth ladder-type filters, respectively. The horizontal axes in FIG. 11A through FIG. 11D represent frequency (MHz). The vertical axes represent second harmonic (dB). The first through fourth ladder-type filters were assumed to have a passband of 2500 MHz to 2570 MHz. The simulation was conducted as follows. An electrical power of 28 dBm was input to the input terminal, and output electrical power at 4980 MHz to 5160 MHz was then measured at the output terminal.

Figure 9A:
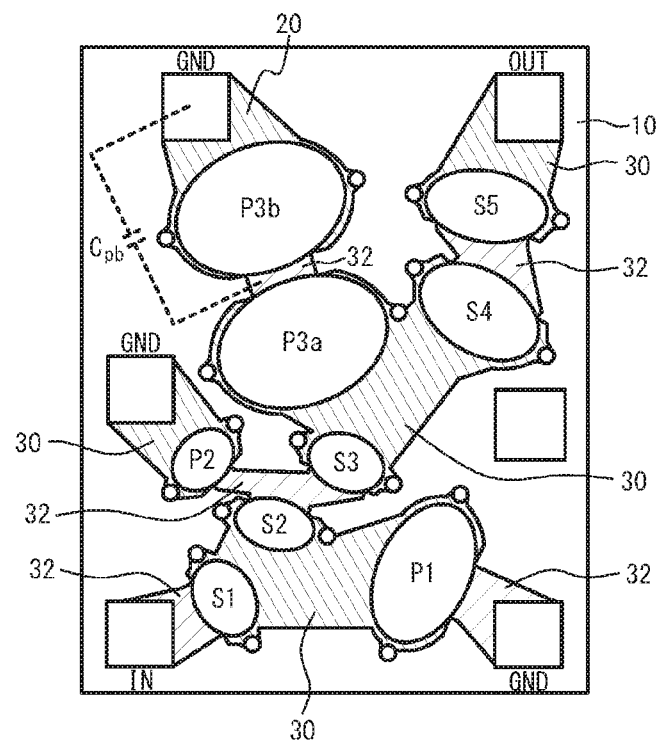
FIG. 9A and FIG. 9B are plan views of first and second ladder-type filters used for a simulation.
Figure 11A:
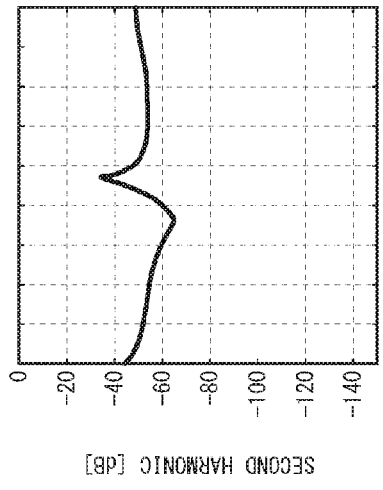
FIG. 11A through FIG. 11D illustrate simulation results of secondary distortion in the first through fourth ladder-type filters.

First, the inventors simulated secondary distortion in the first ladder-type filter illustrated in FIG. 9A. In the first ladder-type filter, the upper wiring line 32 connecting the first and second resonators P3a and P3b was configured to have a length of 35 µm and a width of 100 µm. In the above configured first ladder-type filter, a local peak was formed in the second harmonic as illustrated in FIG. 11A. The inventors considered that the local peak in the second harmonic was caused by a parasitic capacitance Cpb formed between the upper wiring line 32 connecting the first and second resonators P3a and P3b and a ground as illustrated in FIG. 9A. That is, the inventors considered that the antiresonant frequency of the second resonator P3b decreased because of the parasitic capacitance Cpb and became different from the antiresonant frequency of the first resonator P3a, and therefore the local peak was formed because the second harmonic was not cancelled at a frequency twice greater than the antiresonant frequency.

Figure 9B:
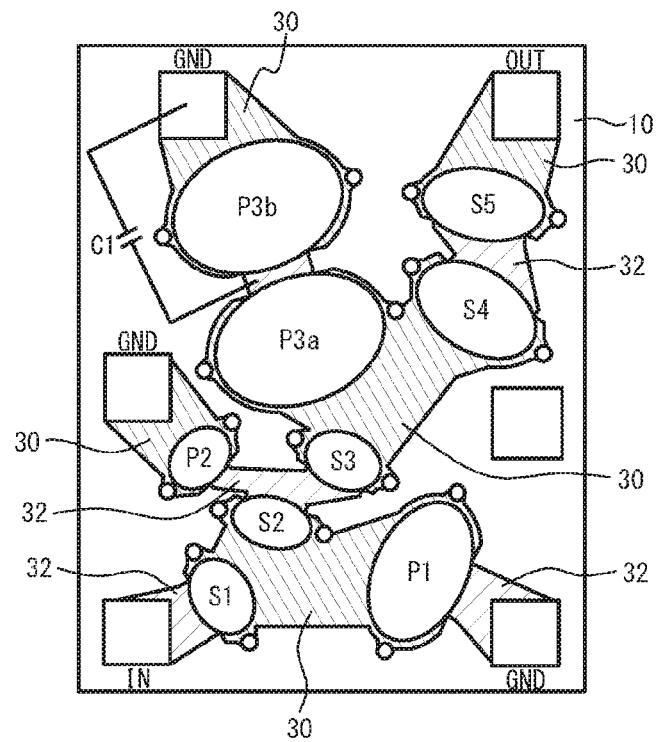
Figure 11B:
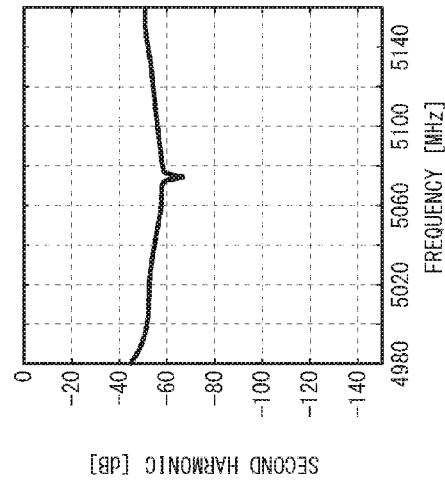

Thus, the inventors simulated secondary distortion in the second ladder-type filter in which the first and second resonators P3a and P3b are connected to each other without a wiring line as illustrated in FIG. 9B (In FIG. 9B, a wiring line is illustrated between the first and second resonators P3a and P3b for convenience sake) and a capacitor C1 is connected in parallel to the second resonator P3b. The capacitor C1 was configured to have a capacitance of 0.02 pF. In the second ladder-type filter, as illustrated in FIG. 11B, a local peak was formed in the second harmonic as in the first ladder-type filter. This result confirms that the local peak was formed in the second harmonic in the first ladder-type filter because of the parasitic capacitance Cpb, which is formed between the upper wiring line 32 connecting the first and second resonators P3a and P3b and a ground.

Figure 11C:
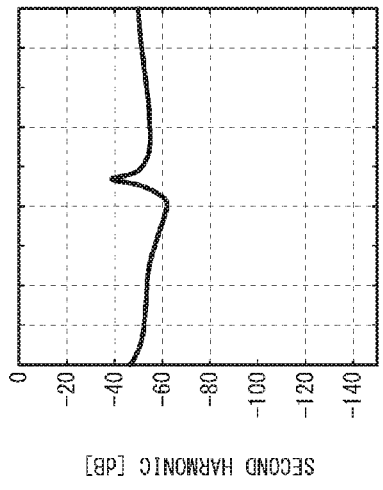

Next, the inventors considered that the difference in antiresonant frequency between the first and second resonators P3a and P3b would be reduced and the local peak in the second harmonic would be reduced by connecting a capacitor C2, which has a capacitance equal to that of the capacitor C1 connected in parallel to the second resonator P3b, in parallel to the first resonator P3a. Thus, secondary distortion in the third ladder-type filter illustrated in FIG. 10A was simulated. Also in FIG. 10A, a wiring line between the first and second resonators P3a and P3b is illustrated for convenience sake. In the third ladder-type filter, the capacitor C1 with a capacitance of 0.02 pF is connected in parallel to the second resonator P3b, and the capacitor C2 with a capacitance of 0.02 pF is connected in parallel to the first resonator P3a. In the third ladder-type filter, a local peak in the second harmonic is reduced as illustrated in FIG. 11C.

Figure 10A:
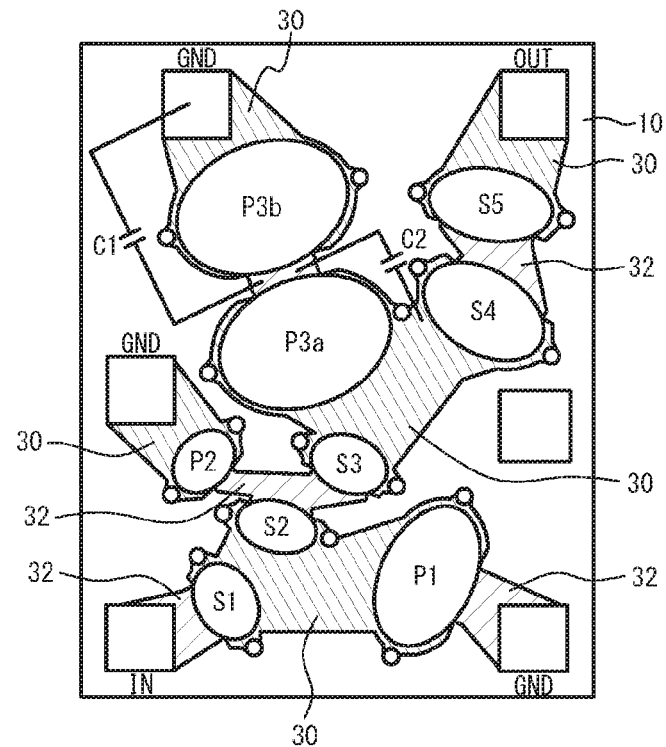
FIG. 10A and FIG. 10B are plan views of third and fourth ladder-type filters used for the simulation.
Figure 10B:
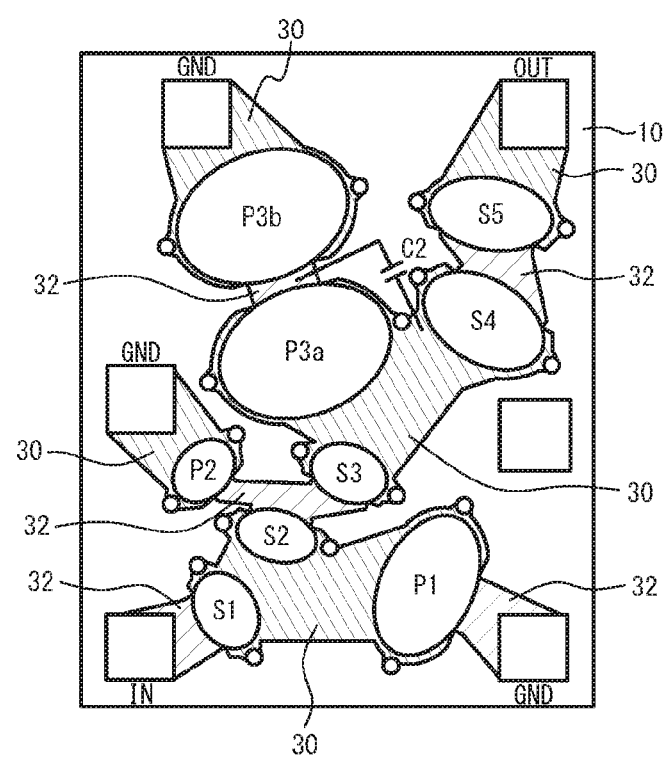
Figure 11D:
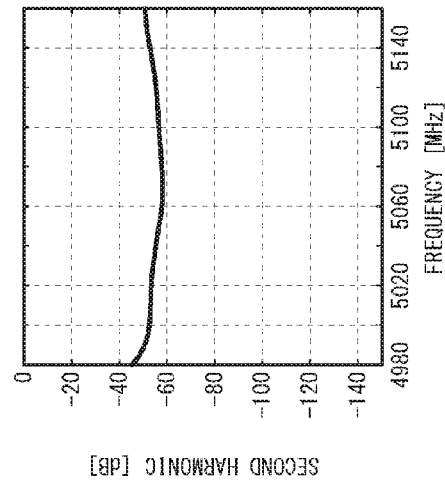

Thus, the inventor simulated secondary distortion in the fourth ladder-type filter in which the capacitor C2 is connected in parallel to the first resonator P3a in the first ladder-type filter as illustrated in FIG. 10B. That is, in the fourth ladder-type filter, the capacitor C2 with a capacitance of 0.02 pF is connected between the upper wiring line 32 between the first and second resonators P3a and P3b and the lower wiring line 30 connecting to the lower electrode 12 of the first resonator P3a. In the fourth ladder-type filter, a local peak in the second harmonic is reduced as illustrated in FIG. 11D.

The above simulations have described that the local peak in the second harmonic was formed by the parasitic capacitance Cpb between the upper wiring line 32 between the first and second resonators P3a and P3b and a ground. This is because the parasitic capacitance Cpb was greater than the parasitic capacitance Cpa between the upper wiring line 32 between the first and second resonators P3a and P3b and the lower wiring line 30 connecting to the lower electrode 12 of the first resonator P3a. That is, in the above simulations, since the parasitic capacitance Cpb was greater than the parasitic capacitance Cpa, the capacitor C2 was connected in parallel to the first resonator P3a. However, when the parasitic capacitance Cpa is greater than the parasitic capacitance Cpb, the local peak in the second harmonic can be reduced by connecting a capacitor in parallel to the second resonator P3b.

Figure 12A:
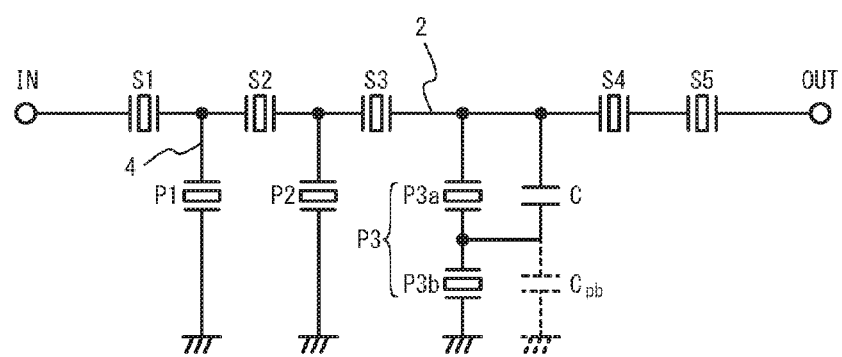
FIG. 12A and FIG. 12B illustrate a relation between a parasitic capacitance and a position to which a capacitor is connected.
Figure 12B:
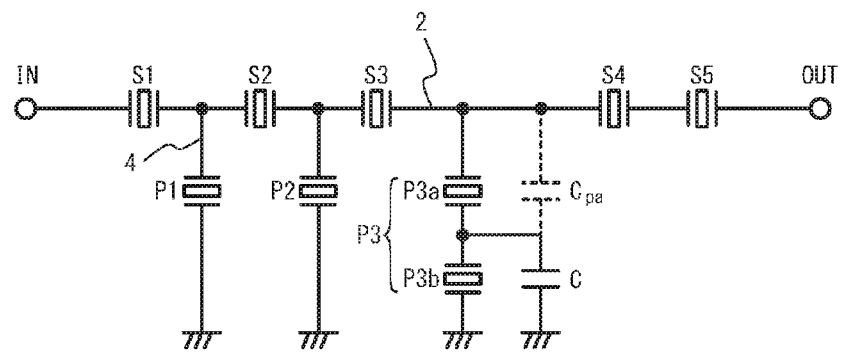

That is, the first embodiment has described an exemplary case where the capacitor C is connected in parallel to the first resonator P3a, but the capacitor C may be connected in parallel to the second resonator P3b depending on the formed parasitic capacitance. This will be described with FIG. 12A and FIG. 12B. FIG. 12A and FIG. 12B illustrate relationships between the parasitic capacitance and the position to which the capacitor is connected. As illustrated in FIG. 12A, when the parasitic capacitance Cpb formed in parallel to the second resonator P3b is greater than the parasitic capacitance Cpa formed in parallel to the first resonator P3a, the capacitor C is connected in parallel to the first resonator P3a. As illustrated in FIG. 12B, when the parasitic capacitance Cpa formed in parallel to the first resonator P3a is greater than the parasitic capacitance Cpb formed in parallel to the second resonator P3b, the capacitor C is connected in parallel to the second resonator P3b.

As described above, in the first embodiment, the capacitor C is coupled to one resonator of the first and second resonators P3a and P3b that are connected in series so that the electrode of the first resonator P3a in the c-axis orientation direction of the piezoelectric substance 14 and the electrode of the second resonator P3b in the c-axis orientation direction of the piezoelectric substance 14 have an identical electric potential, and no capacitor is connected in parallel to the other resonator. This configuration can reduce the local peak in the second harmonic, and can reduce the secondary distortion successfully as described above.

In addition, as in the first embodiment, to reduce the secondary distortion, the capacitor C is preferably connected in parallel to the resonator having less parasitic capacitance formed in parallel of the first and second resonators P3a and P3b.

Figure 13A:
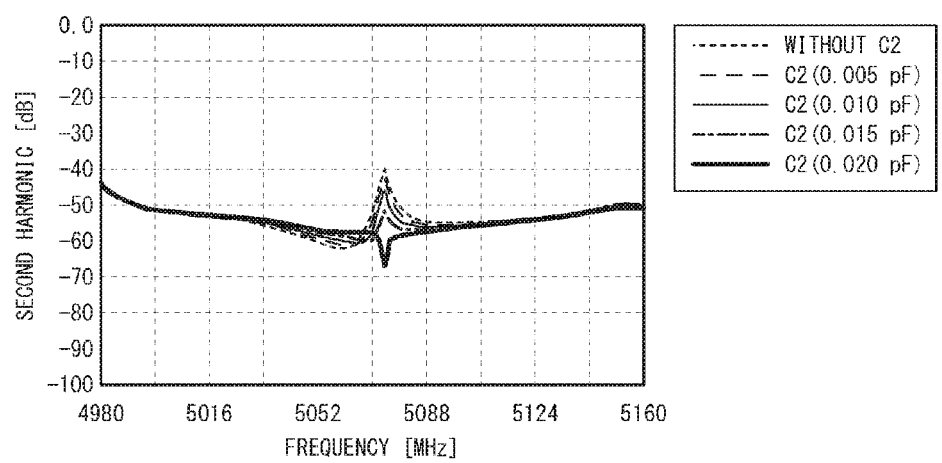
FIG. 13A and FIG. 13B illustrate simulation results of secondary distortion when the electrostatic capacitance of a capacitor included in the fourth ladder-type filter is varied.
Figure 13B:
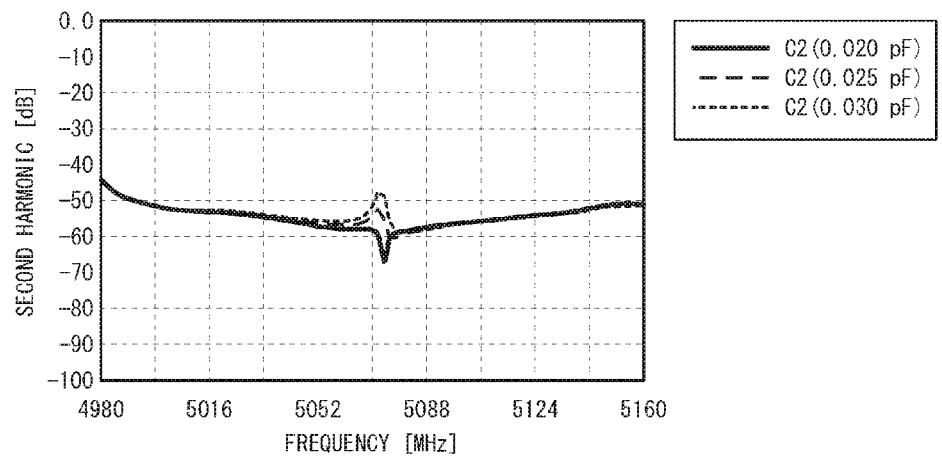

Next, the simulation results of secondary distortion when the electrostatic capacitance of the capacitor C2 is varied in the fourth ladder-type filter of FIG. 10B will be described. FIG. 13A and FIG. 13B illustrate simulation results of secondary distortion when the electrostatic capacitance of the capacitor C2 included in the fourth ladder-type filter was varied. The horizontal axes in FIG. 13A and FIG. 13B represent frequency (MHz). The vertical axes represent second harmonic (dB). The capacitance of the capacitor C2 was varied from 0.005 pF to 0.030 pF by 0.005 increments. FIG. 13A also illustrates the simulation result of the first ladder-type filter in which the capacitor C2 is not connected.

As illustrated in FIG. 13A, from a state where the capacitor C2 is not provided to a state where the capacitor C2 has a capacitance of 0.020 pF, as the capacitance increases, the local peak in the second harmonic decreases. In contrast, as illustrated in FIG. 13B, when the capacitor C2 has a capacitance of 0.020 pF or greater, as the capacitance increases, the local peak in the second harmonic increases. The reason why the local peak is smallest when the capacitor C2 has a capacitance of 0.020 pF is considered to be because the difference between the parasitic capacitance Cpb formed in parallel to the second resonator P3b and the parasitic capacitance Cpa formed in parallel to the first resonator P3a (Cpb-Cpa) was approximately 0.020 pF.

Thus, the capacitor C to be connected in parallel to one of the first and second resonators P3a and P3b preferably has an electrostatic capacitance equal to the absolute value of the difference between the parasitic capacitance Cpa formed in parallel to the first resonator P3a and the parasitic capacitance Cpb formed in parallel to the second resonator P3b. As clear from FIG. 13A and FIG. 13B, even when the capacitor C has an electrostatic capacitance not equal to the absolute value of the difference between the parasitic capacitance Cpa and the parasitic capacitance Cpb, the local peak in the second harmonic can be reduced as long as the electrostatic capacitance of the capacitor C is close to the absolute value. Thus, the electrostatic capacitance of the capacitor C to be connected in parallel to one of the first and second resonators P3a and P3b is preferably approximately equal to the absolute value of the difference between the parasitic capacitance Cpa formed in parallel to the first resonator P3a and the parasitic capacitance Cpb formed in parallel to the second resonator P3b. The term "approximately equal to" means that the electrostatic capacitance of the capacitor C is equal to the absolute value of the difference to the extent that the local peak in the second harmonic can be reduced. The electrostatic capacitance of the capacitor C is preferably within a range of 0.75 to 1.75 times, more preferably a range of 0.5 to 1.5 times, further preferably a range of 0.25 to 1.25 times greater than the absolute value of the difference between the parasitic capacitance Cpa and the parasitic capacitance Cpb.

A local peak will be formed in the second harmonic even when a series resonator is divided in series so that the electrode of one of the divided resonators in the c-axis orientation direction of the piezoelectric substance has an electric potential equal to the electric potential of the electrode of the other of the divided resonators in the c-axis orientation direction of the piezoelectric substance. However, the antiresonant frequency of the series resonator is outside the passband, and the degree of the secondary distortion is very small. Thus, this configuration may not cause a problem.

Figure 14A:
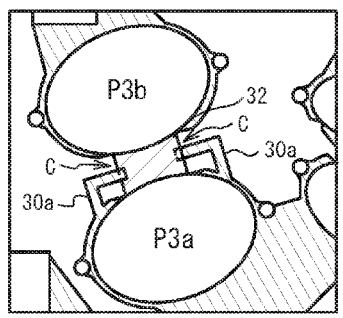
FIG. 14A through FIG. 14D are plan views illustrating how to form the capacitor.
Figure 14B:
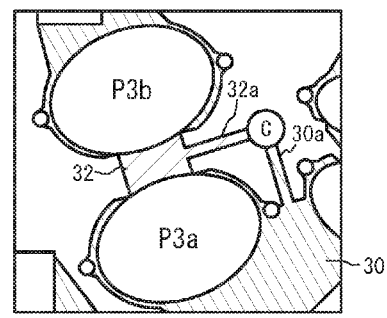

FIG. 14A through FIG. 14D are plan views illustrating how to form the capacitor C. As illustrated in FIG. 14A, the capacitor C may be formed by extending a lower wiring line 30a connecting to the lower electrode 12 of the first resonator P3a to below the upper wiring line 32 between the first and second resonators P3a and P3b, and providing a dielectric film (e.g., AlN, MgO, or SiO$_2$) between the lower wiring line 30a and the upper wiring line 32. As illustrated in FIG. 14B, the capacitor C may be formed by making the lower electrode 12 and the upper electrode 16 face each other across the piezoelectric substance 14 as in the resonator, and not providing the air gap 20 in the region where the lower electrode 12 and the upper electrode 16 face each other. The upper electrode 16 of the capacitor C may be coupled to the upper wiring line 32 between the first and second resonators P3a and P3b through the upper wiring line 32a, and the lower electrode 12 of the capacitor C may be coupled to the lower wiring line 30 connecting to the lower electrode 12 of the first resonator P3a through the lower wiring line 30a.

Figure 14C:
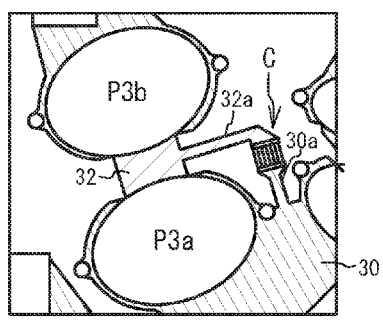
Figure 14D:
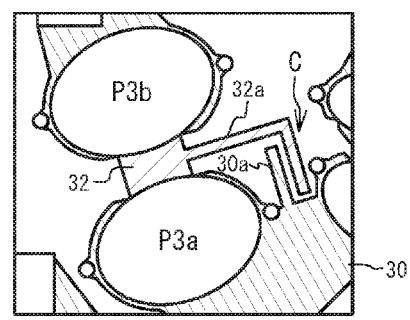

As illustrated in FIG. 14C, the capacitor C may be formed of comb-shaped electrodes. One of the comb-shaped electrodes of the capacitor C may be coupled to the upper wiring line 32 between the first and second resonators P3a and P3b through the upper wiring line 32a, and the other may be coupled to the lower wiring line 30 connecting to the lower electrode 12 of the first resonator P3a through the lower wiring line 30a. As illustrated in FIG. 14D, the capacitor C may be formed by extending the upper wiring line 32a from the upper wiring line 32 between the first and second resonators P3a and P3b, extending the lower wiring line 30a from the lower wiring line 30 connecting to the lower electrode 12 of the first resonator P3a, and providing the upper wiring line 32a and the lower wiring line 30a close to each other in the same plane.

Figure 15A:
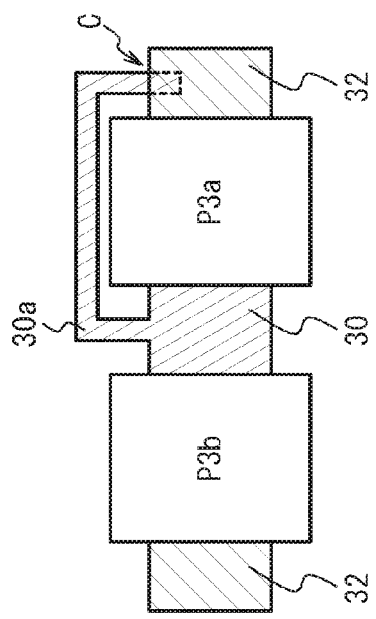
FIG. 15A through FIG. 15D are plan views illustrating how to form the capacitor when a resonance region has a polygonal shape.
Figure 15B:
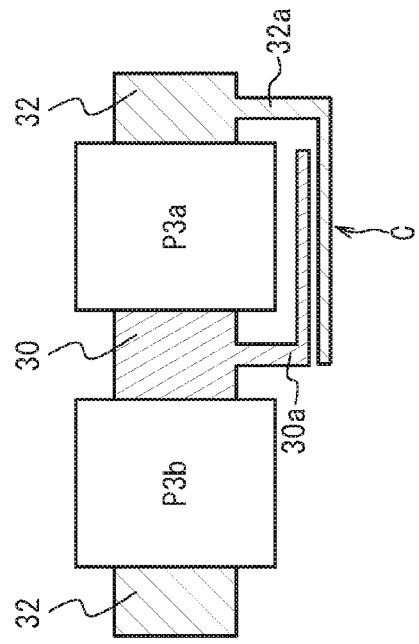

FIG. 15A through FIG. 15D are plan views illustrating how to form the capacitor C when the resonance region has a polygonal shape. As illustrated in FIG. 15A, the capacitor C may be formed by making the lower wiring line 30a connecting to the lower electrode 12 of the first resonator P3a and the upper wiring line 32a connecting to the upper electrode 16 face each other across a dielectric film (e.g., AlN, MgO, or SiO$_2$). As illustrated in FIG. 15B, the capacitor C may be formed by extending the lower wiring line 30a connecting to the lower wiring line 30 between the first and second resonators P3a and P3b to below the upper wiring line 32 connecting to the upper electrode 16 of the first resonator P3a, and providing a dielectric film (e.g., Al, MgO, or SiO$_2$) between the lower wiring line 30a and the upper wiring line 32.

Figure 15C:
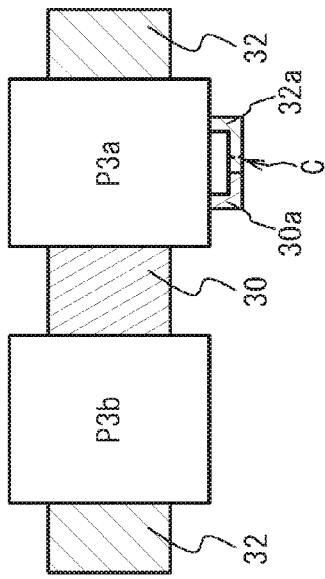
Figure 15D:
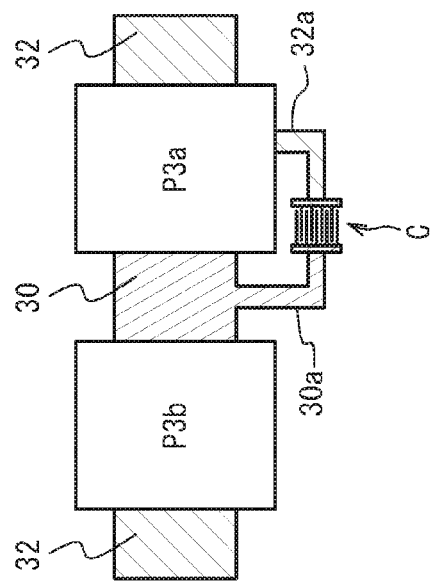

As illustrated in FIG. 15C, the capacitor C may be formed of comb-shaped electrodes. One of the comb-shaped electrodes of the capacitor C may be coupled to the lower wiring line 30 between the first and second resonators P3a and P3b through the lower wiring line 30a, and the other may be coupled to the upper electrode 16 of the first resonator P3a through the upper wiring line 32a. As illustrated in FIG. 15D, the capacitor C may be formed by extending the lower wiring line 30a from the lower wiring line 30 between the first and second resonators P3a and P3b, extending the upper wiring line 32a from the upper wiring line 32 connecting to the upper electrode 16 of the first resonator P3a, and providing the lower wiring line 30a and the upper wiring line 32a close to each other in the same plane.

FIG. 14A through FIG. 15D illustrate exemplary cases where the capacitor C is connected in parallel to the first resonator P3a, but the same technique may be applied to a case where the capacitor C is connected in parallel to the second resonator P3b.

In the first embodiment, the parallel resonators P1 and P2 are not divided. When the parallel resonators P1 and P2 are divided into the first resonators and the second resonators, a capacitor is preferably connected in parallel to the first resonator or the second resonator in each of the parallel resonators P1 and P2. That is, a capacitor may be connected in parallel to the first resonator or the second resonator in at least one of the parallel resonators each being divided into the first resonator and the second resonator, but a capacitor is preferably connected in parallel to the first resonator or the second resonator in each of all the parallel resonators.

Second Embodiment

A second embodiment divides the parallel resonator P3 into three resonators connected in series. FIG. 16A through FIG. 16E are circuit diagrams of a ladder-type filter in accordance with the second embodiment. As illustrated in FIG. 16A through FIG. 16E, in the ladder-type filter of the second embodiment, the parallel resonator P3 is divided into the first resonator P3a, the second resonator P3b, and a third resonator P3c so that the electrode of one of the adjacent resonators in the c-axis orientation direction of the piezoelectric substance has an electric potential equal to the electric potential of the electrode of the other of the adjacent resonators in the c-axis orientation direction of the piezoelectric substance. When the area of a region where the lower electrode 12 and the upper electrode 16 overlap with each other across the piezoelectric substance 14 is appropriately set in each of the first through third resonators P3a through P3c, secondary distortion voltages can cancel out each other. Other configurations are the same as those of the first embodiment, and thus the description thereof is omitted.

Figure 16B:
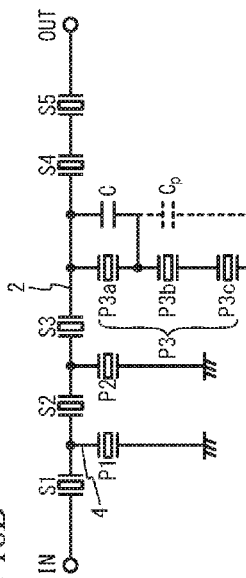
FIG. 16A through FIG. 16E are circuit diagrams of a ladder-type filter in accordance with a second embodiment.
Figure 16D:
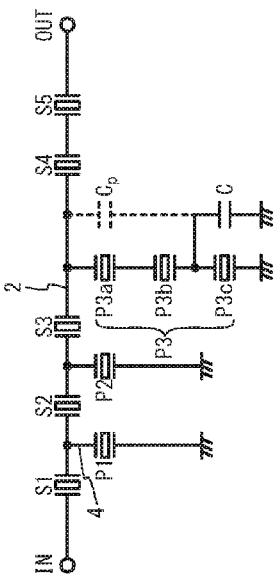
Figure 16A:
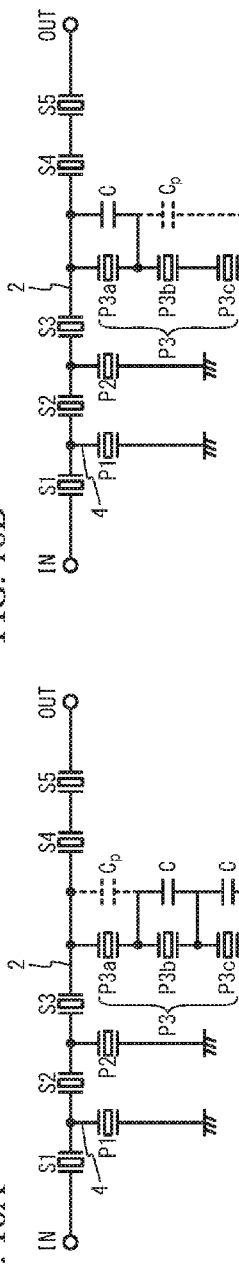
Figure 16C:
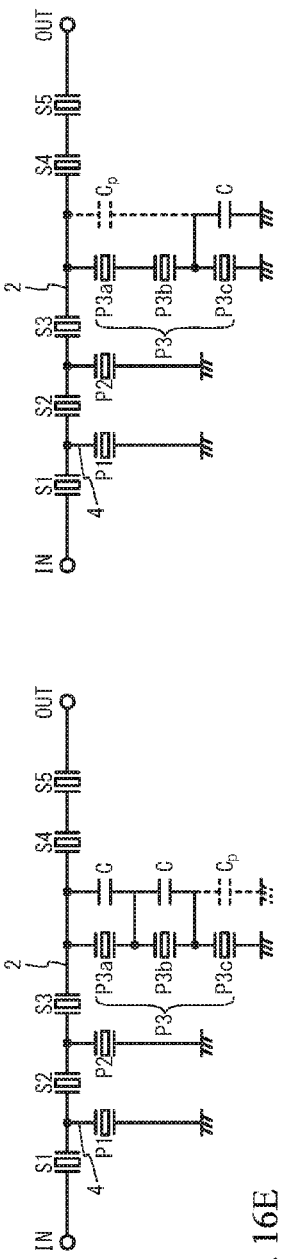
Figure 16E:
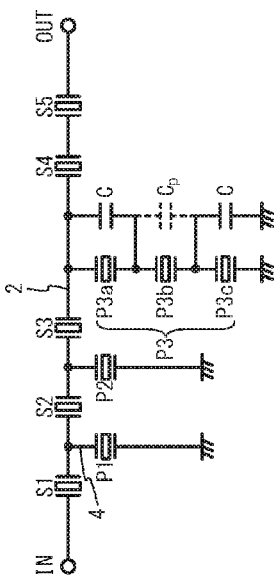

As illustrated in FIG. 16A, when the parasitic capacitance Cp formed in parallel to the first resonator P3a is large, the capacitors C may be connected in parallel to the second resonator P3b and the third resonator P3c. As illustrated in FIG. 16B, when the parasitic capacitance Cp formed in parallel to the second resonator P3b and the third resonator P3c is large, the capacitor C may be connected in parallel to the first resonator P3a. As illustrated in FIG. 16C, when the parasitic capacitance Cp formed in parallel to the third resonator P3c is large, the capacitors C may be connected in parallel to the first and second resonators P3a and P3b. As illustrated in FIG. 16D, when the parasitic capacitance Cp formed in parallel to the first and second resonators P3a and P3b is large, the capacitor C may be connected in parallel to the third resonator P3c. As illustrated in FIG. 16E, when the parasitic capacitance Cp formed in parallel to the second resonator P3b is large, the capacitors C may be connected in parallel to the first and third resonators P3a and P3c.

As described above, when the capacitor C is connected in parallel to at least one of the resonators (the first through third resonators P3a through P3c), and the capacitor C is not connected in parallel to at least one of other resonators, the local peak in the second harmonic is reduced, and the secondary distortion is successfully reduced. In addition, the capacitor C is preferably connected in parallel to a resonator other than the resonator having a larger parasitic capacitance formed in parallel among the resonators.

The first embodiment has described an exemplary case where the parallel resonator is divided into two resonators, and the second embodiment has described an exemplary case where the parallel resonator is divided into three resonators. However, the parallel resonator may be divided into four or more resonators.

Third Embodiment

Figure 17A:
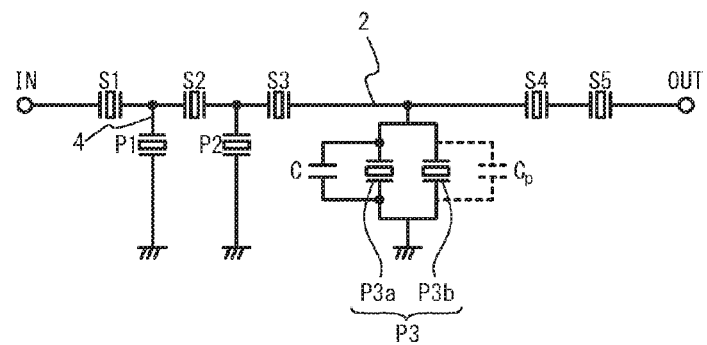
FIG. 17A and FIG. 17B are circuit diagrams of a ladder-type filter in accordance with a third embodiment.
Figure 17B:
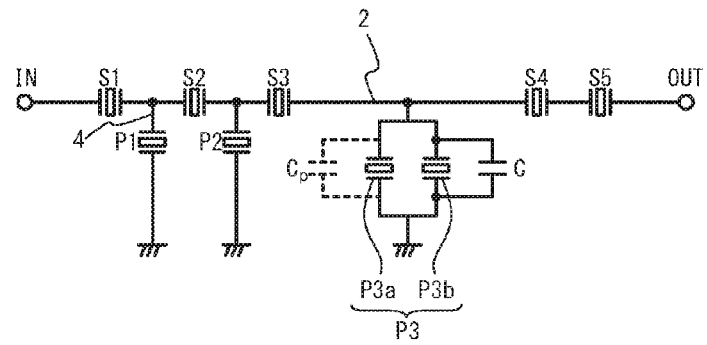

A third embodiment divides the parallel resonator P3 into two resonators connected in parallel. FIG. 17A through FIG. 17B are circuit diagrams of a ladder-type filter in accordance with the third embodiment. As illustrated in FIG. 17A and FIG. 17B, in the ladder-type filter of the third embodiment, the parallel resonator P3 is divided into the first resonator P3a and the second resonator P3b connected in parallel so that the electrode of the first resonator P3a in the c-axis orientation direction and the electrode of the second resonator P3b in the c-axis orientation direction have opposite electric potentials. As illustrated in FIG. 17A, when the parasitic capacitance Cp formed between the input side node and the output side node of the second resonator P3b is large, the capacitor C may be connected between the input side node and the output side node of the first resonator P3a. As illustrated in FIG. 17B, when the parasitic capacitance Cp formed between the input side node and the output side node of the first resonator P3a is large, the capacitor C may be connected between the input side node and the output side node of the second resonator P3b. Other configurations are the same as those of the first embodiment, and thus the description is omitted.

As described above, when the capacitor C is connected between the input side node and the output side node of one of the first and second resonators P3a and P3b and the capacitor C is not connected between the input side node and the output side node of the other, the local peak in the second harmonic is reduced, and the secondary distortion is successfully reduced.

In the third embodiment, as in the first embodiment, when the parallel resonators are divided, a capacitor may be connected between the input side node and the output side node of the first resonator or the second resonator in at least one of the parallel resonators that are divided. However, a capacitor is preferably connected between the input side node and the output side node of the first resonator or the second resonator in each of all the parallel resonators. The parallel resonator may be divided into three or more resonators.

The first through third embodiments have described a piezoelectric thin film resonator including the piezoelectric substance 14 made of AlN as an example. The piezoelectric substance 14 may be MgO, or other piezoelectric substance. When other piezoelectric substance is used, the c-axis orientation may be replaced by a polarization axis to reduce the secondary distortion as in the first through third embodiments.

Fourth Embodiment

Figure 18:
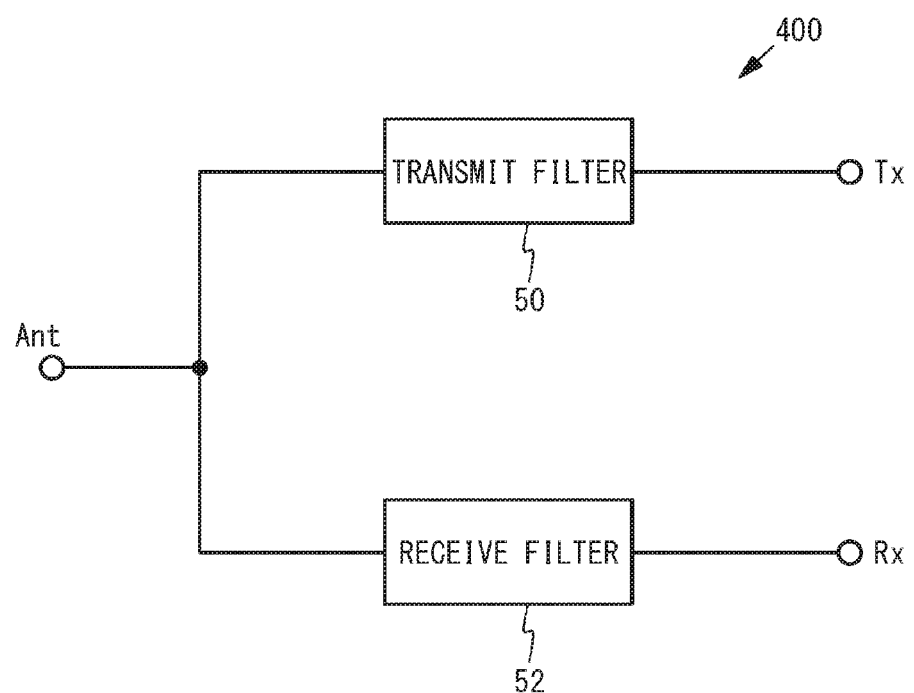
FIG. 18 is a block diagram of a duplexer in accordance with a fourth embodiment.

FIG. 18 is a block diagram of a duplexer 400 in accordance with a fourth embodiment. As illustrated in FIG. 18, the duplexer 400 of the fourth embodiment includes a transmit filter 50 and a receive filter 52. The transmit filter 50 is connected between an antenna terminal Ant and a transmit terminal Tx. The receive filter 52 is connected between the antenna terminal Ant shared by the transmit filter 50 and a receive terminal Rx.

The transmit filter 50 transmits signals in the transmit band to the antenna terminal Ant as transmission signals among signals input from the transmit terminal Tx, and suppresses signals with other frequencies. The receive filter 52 transmits signals in the receive band to the receive terminal Rx as reception signals among signals input from the antenna terminal Ant, and suppresses signals with other frequencies. The transmit band and the receive band have different frequencies. A matching circuit that matches impedance so that a transmission signal passing through the transmit filter 50 is output from the antenna terminal Ant without leaking to the receive filter 52 may be provided.

At least one of the transmit filter 50 and the receive filter 52 included in the duplexer 400 of the fourth embodiment may be the ladder-type filter according to any one of the first through third embodiments.

Fifth Embodiment

Figure 19:
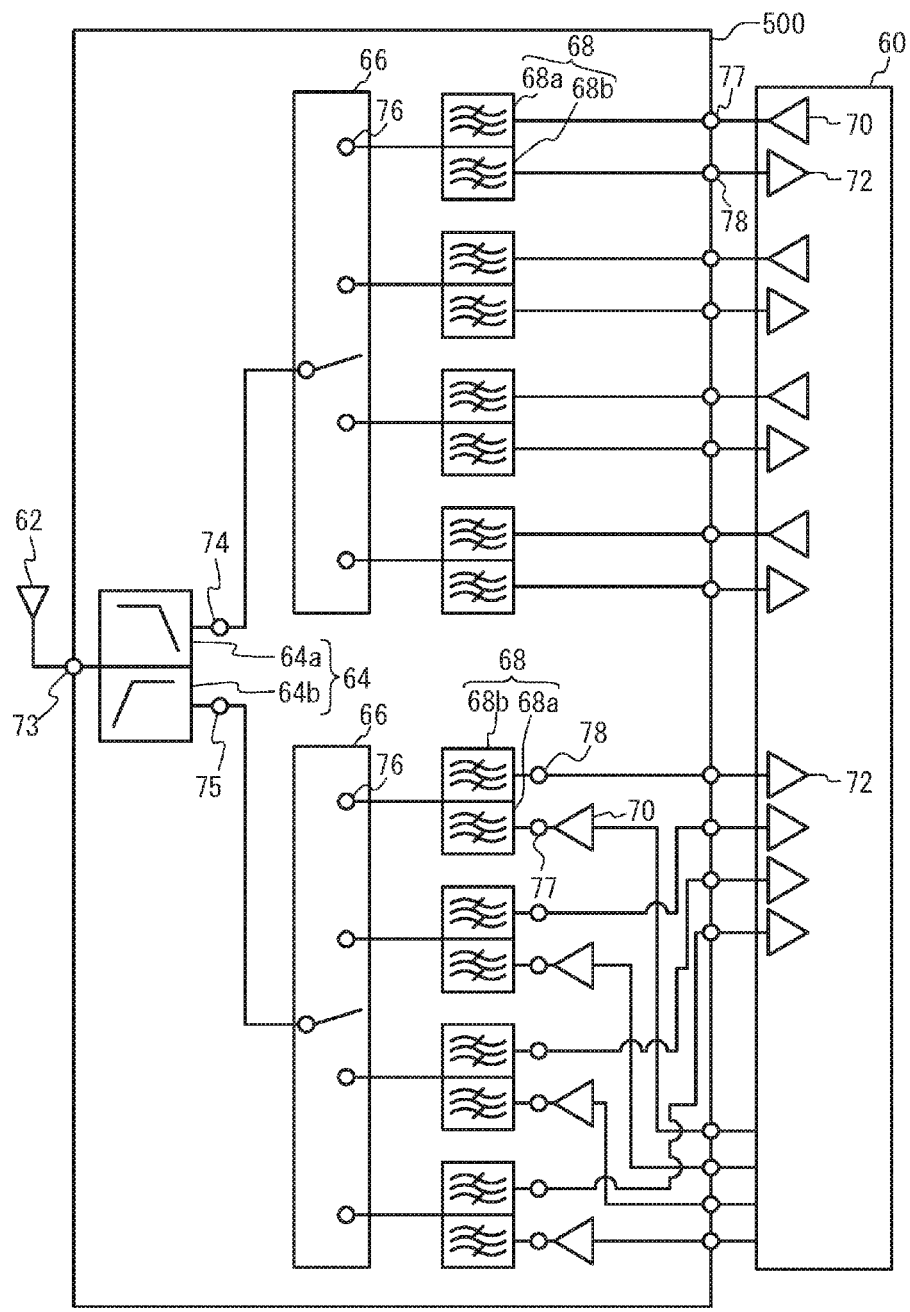
FIG. 19 is a block diagram of a mobile communication device including a module in accordance with a fifth embodiment.

FIG. 19 is a block diagram of a mobile communication device including a module 500 in accordance with a fifth embodiment. As illustrated in FIG. 19, the mobile communication device includes the module 500, which is a transceiver device, an integrated circuit 60, and an antenna 62. The module 500 includes a diplexer 64, switches 66, duplexers 68, and power amplifiers 70. The diplexer 64 includes a Low Pass Filter (LPF) 64a and a High Pass Filter (HPF) 64b. The LPF 64a is connected between terminals 73 and 74. The HPF 64b is connected between terminals 73 and 75. The terminal 73 is coupled to the antenna 62. The LPF 64a allows low-frequency signals out of signals transmitted from/received by the antenna 62 to pass therethrough, and suppresses high-frequency signals. The HPF 64b allows high-frequency signals out of signals transmitted from/ received by the antenna 62 to pass therethrough, and suppresses low-frequency signals.

The switch 66 connects the terminal 74 to one of terminals 76 and the terminal 75 to one of terminals 76. The duplexer 68 includes a transmit filter 68a and a receive filter 68b. The transmit filter 68a is connected between terminals 76 and 77. The receive filter 68b is connected between terminals 76 and 78. The transmit filter 68a allows signals in the transmit band to pass therethrough, and suppresses other signals. The receive filter 68b allows signals in the receive band to pass therethrough, and suppresses other signals. The power amplifier 70 amplifies and outputs transmission signals to the terminal 77. A low noise amplifier 72 amplifies reception signals output to the terminal 78.

The module 500, which is a transceiver device, may employ the ladder-type filter according to any one of the first through third embodiments as the transmit filter 68a or the receive filter 68b of the duplexer 68. The module 500 may include the power amplifier 70 and/or the low noise amplifier 72.

As described above, the ladder-type filters of the first through third embodiments can structure a transceiver device that is coupled to the antenna 62, is mounted on a motherboard together with the power amplifier 70, and transmits and receives communication signals.

Although the embodiments of the present invention have been described in detail, it is to be understood that the various change, substitutions, and alterations could be made hereto without departing from the spirit and scope of the invention.

What is claimed is:

1. An acoustic wave filter comprising:
one or more series resonators connected in series between an input terminal and an output terminal; and
one or more lines connected in parallel to the one or more series resonators,
wherein at least one line of the one or more lines includes:
a first resonator that includes a piezoelectric substance, and a first lower electrode and a first upper electrode sandwiching the piezoelectric substance in a direction of a c-axis orientation or a polarization axis of the piezoelectric substance;
a second resonator that is connected in series to the first resonator, and includes another piezoelectric substance, and a second lower electrode and a second upper electrode sandwiching the another piezoelectric substance so that one of the second lower electrode and the second upper electrode in the direction of the c-axis orientation or the polarization axis have an electric potential equal to an electric potential of one of the first lower electrode and the first upper electrode of the first resonator in the direction of the c-axis orientation or the polarization axis; and
a capacitor that is connected in parallel to only one of the first resonator and the second resonator, and is not connected in parallel to another one of the first resonator and the second resonator.

2. The acoustic wave filter according to claim 1, wherein the capacitor is connected in parallel to a resonator with a smaller parasitic capacitance formed in parallel of the first resonator and the second resonator.

3. The acoustic wave filter according to claim 1, wherein the capacitor has an electrostatic capacitance approximately equal to an absolute value of a difference between a parasitic capacitance formed in parallel to the first resonator and a parasitic capacitance formed in parallel to the second resonator.

4. The acoustic wave filter according to claim 1, wherein the capacitor has a structure in which a lower wiring line connecting to the first lower electrode or the second lower electrode and an upper wiring line connecting to the first upper electrode or the second upper electrode face each other across a dielectric film.

5. The acoustic wave filter according to claim 1, wherein the capacitor has a structure in which a lower wiring line connecting to the first lower electrode or the second lower electrode and an upper wiring line connecting to the first upper electrode or the second upper electrode are close to each other in a same plane.

6. An acoustic wave filter comprising:
one or more series resonators connected in series between an input terminal and an output terminal; and
one or more lines connected in parallel to the one or more series resonators,
wherein at least one of the one or more lines includes:
a first resonator that includes a piezoelectric substance, and a first lower electrode and a first upper electrode sandwiching the piezoelectric substance in a direction of a c-axis orientation or a polarization axis of the piezoelectric substance;
a second resonator that is connected in parallel to the first resonator, and includes another piezoelectric substance, and a second lower electrode and a second upper electrode sandwiching the another piezoelectric substance so that one of the second lower electrode and the second upper electrode in the direction of the c-axis orientation or the polarization axis have an electric potential opposite to an electric potential of one of the first lower electrode and the first upper electrode of the first resonator in the direction of the c-axis orientation or the polarization axis; and
a capacitor that is connected between an input side node and an output side node of one of the first resonator and the second resonator and is not connected between an input side node and an output side node of another one of the first resonator and the second resonator.

7. A duplexer comprising:
a transmit filter; and
a receive filter,
wherein at least one of the transmit filter and the receive filter is the acoustic wave filter according to claim 1.

8. A duplexer comprising:
a transmit filter; and
a receive filter,
wherein at least one of the transmit filter and the receive filter is the acoustic wave filter according to claim 6.

9. A module comprising:
the acoustic wave filter according to claim 1.

10. A module comprising:
the acoustic wave filter according to claim 6.

* * * * *